United States Patent [19]

Bernsen et al.

[11] Patent Number: 5,568,524
[45] Date of Patent: Oct. 22, 1996

[54] FILTER DEVICE COMPRISING A RECURSIVE FILTER UNIT, METHOD OF FILTERING, AND TRANSMISSION SYSTEM COMPRISING SUCH A FILTER DEVICE

[75] Inventors: Johannes A. C. Bernsen, Eindhoven, Netherlands; Seiji Kashioka, Beverly Hills, Calif.

[73] Assignee: U.S. Philips Corporation, New York, N.Y.

[21] Appl. No.: 358,441

[22] Filed: Dec. 19, 1994

[30] Foreign Application Priority Data

Dec. 17, 1993 [EP] European Pat. Off. .............. 93203568

[51] Int. Cl.⁶ ...................................................... H04B 1/10
[52] U.S. Cl. ...................................... 375/350; 364/724.17
[58] Field of Search ...................................... 375/350, 232; 348/625; 364/724.17, 724.01

[56] References Cited

U.S. PATENT DOCUMENTS

| | | | |
|---|---|---|---|
| 4,050,084 | 9/1977 | Rossi | 348/668 |
| 4,064,530 | 12/1977 | Kaiser et al. | 358/36 |
| 4,803,547 | 2/1989 | Stratton | 348/668 |
| 5,392,315 | 2/1995 | Laud | 375/232 |

FOREIGN PATENT DOCUMENTS

| | | | |
|---|---|---|---|
| 0592932 | 4/1994 | European Pat. Off. | H04N 5/21 |
| 61-184059 | 8/1986 | Japan | H04N 5/208 |
| 2276064 | 9/1994 | United Kingdom | 375/350 |

OTHER PUBLICATIONS

"Multiple Model Recursive Estimation of Images" by V. K. Ingle and J. W. Woods, published in IEEE conference on Acoustics, Speech and Signal Processing 1979 (Washington DC) pp. 642 to 645 (notably Fig. 2).

"An Objective and Subjective Evaluation of Edge Detection Methods in Images" by J. Bernsen, Philips Journal of Research 1991, pp. 57–94.

"A Computational Approach to Edge Detection", by J. J. Canny, IEEE Transactions on Pattern Analysis and Machine Intelligence, vol. PAMI–8, No. 6, pp. 679–698, Nov., 1986.

"Using Canny's Criteria to Derive a Recursively Implemented Optimal Edge Detector" by R. Deriche, International Journal of Computer Vision, pp. 167–187, 1987.

"Optimal Filter for Edge Detection Methods and Results" by S. Castan et al., Computer Vision ECCV 90, pp. 13–17, O. Faugeras ed., Springer Verlag, Berlin 1990.

Primary Examiner—Stephen Chin
Assistant Examiner—T. Ghebretinsae
Attorney, Agent, or Firm—Edward W. Goodman

[57] ABSTRACT

During filtering of an image having different regions, the operation of a filter unit is adapted in response to the detection of a boundary between these regions. To this end, one or more intermediate signal values stored in the filter unit for recursive use and derived from signal values from a first region are replaced before any signal value from the second region is filtered. The intermediate signal values are replaced by one or more signal values from the second region, or by filtered signal values derived from the signal values from the second region.

9 Claims, 3 Drawing Sheets

FILTER DEVICE COMPRISING A RECURSIVE FILTER UNIT, METHOD OF FILTERING, AND TRANSMISSION SYSTEM COMPRISING SUCH A FILTER DEVICE

BACKGROUND OF THE INVENTION

1. Field of the Invention

The invention relates to a filter device, comprising a recursive filter unit, a transition detector for dectecting a transition in an input signal of the filter unit, and adaptation means for adapting the operation of the filter unit in response to detection of the transition.

The invention also relates to a transmission system which comprises a filter device and a receiver for such a transmission system.

The invention also relates to a method of filtering an input signal, in which the input signal is subjected to a recursire filtering operation and a transition in an input signal is detected, the recursive filtering operation being adapted in response to detection of the transition.

2. Description of the Related Art

Such a filter device and method are known from an article by V. K. Ingle and J. W. Woods, entitled "Multiple model recursive estimation of images", published in the Proceedings of the IEEE conference on Acoustics, Speech and Signal Processing 1979 (Washington, D.C.), pp. 642 to 645 (notably FIG. 2). This article deals with the problem of removal of noise from two-dimensional images such as video images.

Noise can be removed from an image by means of a low-pass filter. Such a filter, however, has the drawback that it blurrs the boundaries between the objects in the image. The cited Application proposes to address the problem by rendering the operation of the filter dependent on transitions in the image.

To this end, the filter comprises a gradient detector which associates each location in the image with one of five possible gradient classes:

(1) the image values in the vicinity of the location have a gradient-less structure, or (2–5) the image values are situated on a gradient which is classified in one of four directions (0, 45, 90 and 135 degrees, respectively).

The filter comprises a bank of five parallel recursive partial filters, each of which is suitable for the filtering of noise while maintaining sharpness for one of the classes. For each location, it is determined, in dependence on the detected class, which of these recursive filters has its output signal coupled to the output of the filter.

Lack of sharpness can thus be prevented, be it that five recursive filters are required. Circuits implementing the filter disclosed in the cited publication thus become complex. Moreover, the recursive filters need to average over mutually different, oriented regions, so that they deviate from one another and also have an individual complex construction.

SUMMARY OF THE INVENTION

It is inter alia an object of the invention to provide a method and a device for executing filtering operations which do not make edges unsharp and which can be readily implemented.

It is another object of the invention to provide a method and a device for executing filtering operations in two-dimensional or more-dimensional signals which avoid unsharpness of edges and which can be readily implemented.

It is a further object of the invention to provide a method and a device in which the filtering operation is carried out by repeated use of the same partial filtering operation.

The filter device in accordance with the invention is characterized in that the detector is operative to detect a boundary between a first and a subsequent second region in the input signal, the adaptation means being operative to replace one or more intermediate signal values, stored in the filter unit for recursive use and derived from signal values from the first region, by one or more signal values from the second region, or by filtered signal values derived from the signal values from the second region, before filtering any signal value from the second region. The recursive filter unit can be readily implemented. At the boundary, the intermediate signal values stored are replaced by intermediate signal values formed from the second region. As a result, the "remembering" of the first region by the filter is cancelled, which remembering would otherwise influence the filtering operation in the second region. The foregoing results in simple and effective adaptation of the operation of such a filter unit and also ensures sharp edges.

An embodiment of the device in accordance with the invention is characterized in that it is operative to average the input signal, the one or more intermediate signal values being mean values of already received signal values of the input signal, and that the device is also operative to replace one or more intermediate signal values by one or more signal values from the second region which occur at a predetermined distance from the boundary in the input signal. For recursive averaging, it suffices to replace the intermediate signal values, formed by accumulation of the signal values from the first region, by "fresh" signal values from the second region.

Filtering is often applied to reduce noise. As more signal values are combined with one another, the noise becomes comparatively less strong. Immediately after passage of the boundary, the recursive filtering result will depend on only a few input signals, whereas in the absence of the boundary it would depend on more signal values. Because averaging thus takes place over fewer signal values, the noise in the result is comparatively stronger than otherwise.

An embodiment of the device in accordance with the invention is characterized in that it is operative to subject the input signal to a first and a second recursive filtering operation, the input signal for the second recursive filtering operation being formed by signal values of an output signal in response to the first recursive filtering operation in the reverse sequence in comparison with the sequence in which they have been formed, the role of the first and the second region being interchanged for the second recursive filtering operation in comparison with the first recursive filtering operation. Two filtering operations are thus cascaded. The result of the cascaded filtering operation is always a combination of a number of signal values which is larger than the result of the filtering operation of the first partial signal. The noise in the result of the filtering operation of the second partial signal, therefore, is comparatively less. Inversion takes place, for example, by temporarily storing the results and by subsequently reading the results in a "Last In First Out" fashion. The partial signals can thus be successively conducted through the same filter unit. Recursive filtering can also be performed by a double filter unit, each partial signal going to a separate section.

An embodiment of the device in accordance with the invention, in which the input signal values are associated with respective locations in a two-dimensional or multi-dimensional space, is operative to use the input signal values first arranged according to a first dimensional direction as an input signal for the filter unit, and to use subsequently results of this filtering operation arranged according to a further dimensional direction as an input signal for the filter unit. Two-dimensional or multi-dimensional filtering can thus be realized. The output signal obtained is a combination of signal values from at least two-dimensional regions. For example, a coordinate axis of the space can be used as a dimensional direction. This direction determines a number of one-dimensional signals, each of which corresponds to signal values of a location on a respective line extending parallel to this axis. The input signal values according to a first dimensional direction can be used as an input signal for the filter unit, for example, by using each of the one-dimensional signals per se as an input signal for the filter unit.

One embodiment of the invention relates to a device adapted for multi-dimensional filtering in the described manner, filtering taking place twice in cascaded form as stated and the filter device being operative to perform, on the same input signal values on which the first cascade is performed, a second cascade of filtering operations which is equal to the first cascade, except for interchanging of the first and the second dimensional direction, the device comprising combination means for combining the results formed from the first and the second cascade for the same location. The symmetry of the response of the filter device is thus enhanced, and, at the same time, the shape of the response is no longer dependent on the dimensional direction in which filtering is performed first.

In an embodiment of the device in accordance with the invention, in which the input signal values are associated with respective locations in a two-dimensional or multi-dimensional space, the transition detector is operative to detect the boundary on the basis of two-dimensional or multi-dimensional signal patterns in respective environments of respective locations. For this purpose, use can be made of a variety of known edge detectors, for, example, the Soebel operator, the Canny operator, etc.

An embodiment of a transmission system comprising a filter device in accordance with the invention is subdivided into a transmitter and a receiver, the transmitter comprising the transition detector and being operative to transmit a combination of the input signal and an indication of detection of the transition to the receiver which comprises the filter unit, the adaptation means and transition indication receiving means for receiving detection indication, and which is operative to control the adaptation means in response to the indicated detections. Thus, the adaptation means receive an indication of the boundary which is independent of possible corruption of the input signal due to the transmission between transmitter and receiver. Moreover, for a system comprising a plurality of receivers only one transition detector is required.

In order to prevent corruption of the indication of the detection, indications can be transmitted in a manner which is less sensitive to noise, for example, with a higher power density or by means of an error correction code. Because such indications contain a substantially smaller amount of information than the input signal, comparatively speaking, the information capacity required for transmission is hardly increased.

BRIEF DESCRIPTION OF THE DRAWINGS

These and further aspects of the invention and its advantages will be described with reference to a number of Figures.

DESCRIPTION OF THE PREFERRED EMBODIMENTS

SHARPNESS-SUSTAINING FILTERING

Figure 1:
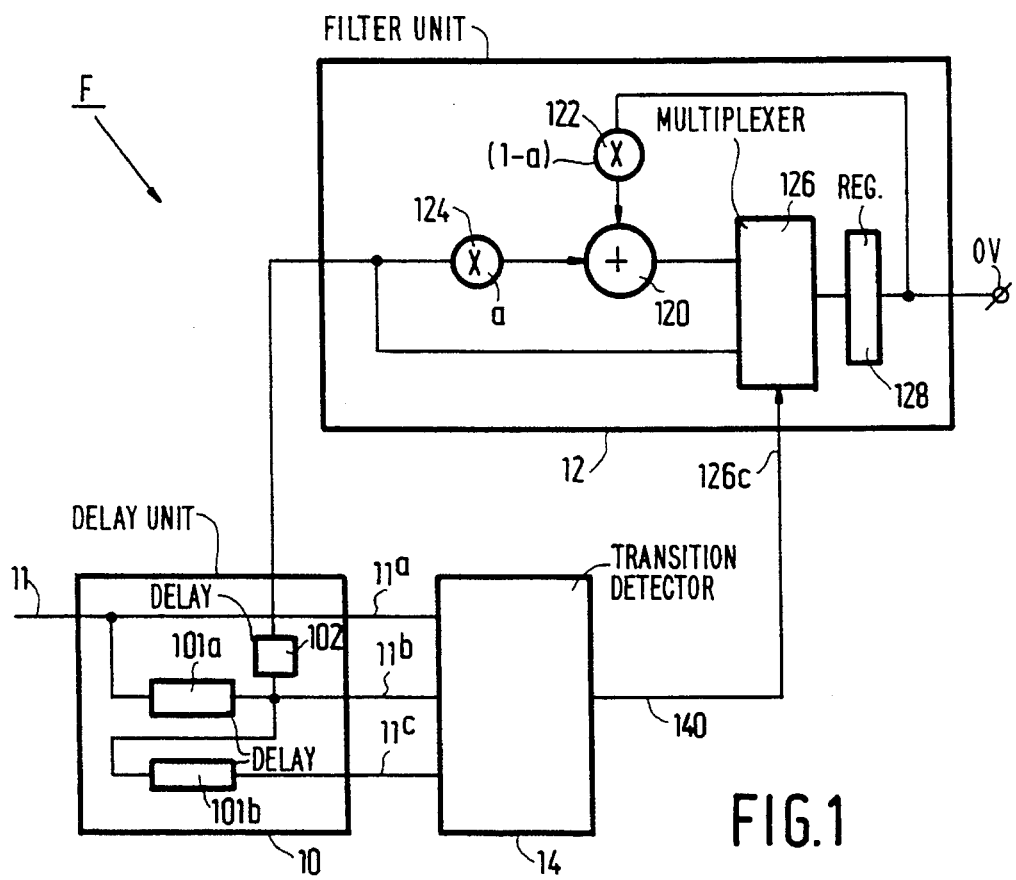
FIG. 1 shows a filter in accordance with the invention.

FIG. 1 shows a filter device F in accordance with the invention. The filter device F comprises an input 11 which is connected to a delay unit 10. The delay unit 10 is coupled to a transition detector 14 and a filter unit 12 and comprises an output OU.

The delay unit 10 comprises a series connection of two delay lines 101a and 101b. The input 11 is connected to the first delay line 101a. The delay unit 10 comprises three outputs 11a–c which are tapped from the series connection, i.e., tapped in front of, between and behind the delay lines 101a and 101b. The delay unit 10 comprises a further output which couples the output tapped between the delay lines 101a and 101b to the input of the filter unit via a further delay element 102.

The filter unit 12 comprises a first multiplier 124 whose input is coupled to the input of the filter unit 12. The output of the first multiplier 124 is coupled to a first input of an adder 120. The output of the adder 120 is coupled to a first input of a multiplexer 126. The output of the multiplexer is coupled to a register 128. The output of the register 128 is coupled to the output of the filter unit 12 and to the input of a second multiplier 122 and also constitutes the output OU of the filter device. The output of the second multiplier 122 is coupled to a second input of the adder 120. The input of the filter unit 12 is also coupled to the second input of the multiplexer 126.

The transition detector 14 comprises an output 140 which is coupled to a control input 126c of the multiplexer 126 in the filter unit 12.

A video signal is presented to the input 11 during operation. This signal contains, for example, the grey values associated with respective pixels. These grey values successively appear, one image line after the other, on the input. The filter unit 12 determines a running average of the grey values. The transition detector 14 detects the boundaries between different regions in the image and controls the filter unit 12 in dependence on the boundaries detected.

The operation of the filter unit 12 will be described in detail hereinafter; first of all it will be described for normal operation, i.e., operation where the transition detector 14 does not detect a boundary. During normal operation, the multiplexer 126 applies the output signal of the adder 120 to the register 128.

The filter operates under the control of a clock (not shown in FIG. 1). During each successive clock cycle, the contents of the register 128 are refreshed by the output signal "$u_n$" of the multiplexer 126. To this end, the register 128 contains the last preceding output signal "$u_{n-1}$" of the multiplexer 126. During normal operation, the output signal "$u_n$" of the multiplexer 126 is a combination of the input signal $i_n$ of the filter unit 12 and the output signal "$u_{n-1}$" of the register 128:

$$u_n = a i_n + (1-a) u_{n-1}$$

The multipliers 122, 124 and the adder 120 determine $u_n$. The first multiplier 124 multiplies the input signal $i_n$ of the filter unit 12 by a fixed amount "a". The second multiplier 122 multiplies the output signal $u_{n-1}$ of the register 128 by a fixed amount "1−a". The output signal of the adder 120 is the sum of the output signals of the first and the second multiplier 122, 124.

The filter is a so-called recursire linear filter. The output signal $u_n$ depends inter alia on the preceding value of the output signal $u_{n-1}$, which, in its turn, is dependent on the preceding value of the input signal $i_{n-1}$. Thus, the output signal $u_n$ is dependent on all preceding input signal values $i_{n-m}$, where m=0, 1 ... More specifically, it is a weighted mean value of the preceding input signal values $i_{n-m}$, where the weight $w_m = (1-a)^m$ decreases as a function of the age, expressed as a number of clock beats, of the input value $i_{n-m}$. For example, if a=0.08, the contribution of $i_{n-10}$ to the weighted mean value will only be half that of $i_n$.

The transition detector 14 detects boundaries between regions in the image. Various known transition detectors can be used for this transition detector. For a survey of feasible transition detectors, reference is made to an article by J. Bernsen, entitled "An objective and Subjective evaluation of edge detection methods in images", Philips Journal of Research 1991, pp. 57–94. By way of example, FIG. 1 shows a transition detector 14 which comprises a parallel input for three image lines. The delay unit 10 applies successive image lines thereto. Each of the delay lines 101a, 101b in the delay unit delays the grey values for a period of one image line. Thus, the grey values of three successive image lines are applied in parallel to the transition detector 14.

The transition detector 14 receives successive grey values of three image lines. The transition detector 14 internally memorizes, for each image line, the respective two previously arrived grey values. In conjunction with the newly arrived grey values, the transition detector thus has available the grey values of a square of three by three locations in the image. On the basis of these grey values, it is detected whether a boundary extends through the square. The boundary can be detected, for example, by construing a function having function values which approximate the grey values in the locations in the square as Well as possible, determine the gradient of this function, and detect the edge if the amplitude of the gradient exceeds a predetermined threshold.

Regions larger than squares of three by three locations can also be used for the detection of the transition; for example, see an article by J. J. Canny "A computational Approach to edge detection", in IEEE transactions on Pattern Analysis and Machine Intelligence, Vol. PAMI-8, No. 6, pp. 679–698, November 1986; evidently, a correspondingly larger number of delay lines is then required. Use can also be made of a recursive edge detector, for example, see R. Deriche "Using Canny's Criteria to derive a recursively implemented optimal edge detector" in International Journal of Computer vision, pp. 167–187, 1987, or S. Castan et at. "Optimal filter for edge detection methods and results" in Computer Vision ECCV 90, pp. 13–17, O. Faugeras ed., Springer Verlag, Berlin 1990. In this case, only one delay line is required which ensures that the indication of transitions coincides with supplying the filter unit with the image value of the location in the image in which the transition occurs.

The transition detector 14 applies the signal indicating the detection of a boundary to the multiplexer 126. When the boundary is indicated, the multiplexer 126 couples the signal on its second input, being the input signal of the filter, to its output: $u_n = i_n$. In response to the subsequent clock beat, the register 128 stores this signal. The delay between the input 11 of the filter and the input of the filter unit 12 (the delay line 101a and the delay element 102) is chosen so that when the boundary is indicated, exactly the first grey value from beyond the boundary is applied to the filter unit 12 as the input signal $I_n$.

Due to the switching-over of the multiplexer 126, the output signal $u_n$ of the multiplexer is then independent of the grey values from before the boundary. The successively determined output values $u_{n+1}$, $u_{n+2}$ etc., will also be independent of the grey values from before the boundary. They are a weighted mean value of the grey values from beyond the boundary. The output signal of the filter unit 12, therefore, will contain a sharp boundary.

Thus, upon passage of the boundary, the number stored in the register 128 is replaced in a manner other than the usual manner. This is done to eliminate the effect of signal values from before the boundary on filter results from beyond the boundary. This effect would occur because the number in the register 128 is dependent on the signal values from before the boundary, and also because the register forms a memory which is used also beyond the boundary. Upon passage of the boundary, the number in the register 128 is replaced by a number which is an approximation of the number which would be present in this register if the region beyond to the transition were to continue before the boundary. Undesirable influencing across the boundary is thus prevented.

Figure 2:
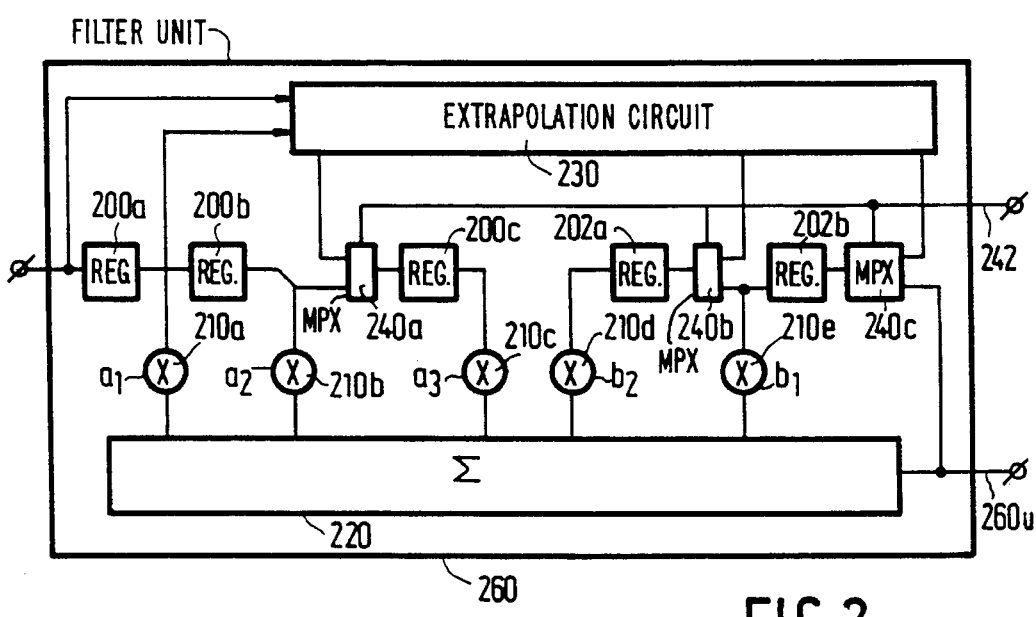
FIG. 2 shows a filter unit for use in a filter in accordance with the invention.

This technique can be used for a variety of filter units. By way of example, FIG. 2 shows a more complex filter unit 260. It includes an input chain comprising several registers 200a–200c. The input chain is coupled, via multipliers 210a–210c, to inputs of an adder 220. The output 260u of the adder 220 constitutes the output of the filter unit 260. The output 260u is coupled to an output chain of registers 202a and 202b.

The input chain is also coupled to inputs of an extrapolation circuit 230. Multiplexers 240a–240c are connected between the various registers 200a–200c and 202a and 202b. Each multiplexer has a first input coupled to the chain in which it is included. The second input is coupled to the extrapolation circuit 230. A test input 242 is coupled to the control input of the various multiplexers 240a–240c.

The circuit shown in FIG. 2 operates under the control of a clock (not shown in FIG. 2). The circuit of FIG. 2 can be used instead of the filter unit 12 of FIG. 1. In that case the output of the transition detector 14 is coupled to the test input 242.

During operation, the contents of the registers 200a–200c, 202a and 202b are refreshed in response to successive clock beats. During normal operation, that is to say in the absence of a boundary, the output signal $u_n$ of the filter unit 260 is given by $$u_n = a_1 i_{n-1} + a_2 i_{n-2} + a_3 i_{n-3} + b_1 u_{n-1} + b_2 u_{n-2}$$

The various terms in this addition correspond to the output signals of the various multipliers 210a–210e. This filter is also of the recursive linear type.

When the boundary is indicated, the multiplexers 240a–240c are switched over. Thus, extrapolated signal values originating from the extrapolation circuit 230 are loaded into some registers 200c, 202a, 202b of the input chain and the output chain. The multiplexers 240a–240c are arranged so that they replace exactly the signal values in the input chain and the output chain which are dependent on the signal from before the boundary by extrapolated signal values. The extrapolated signal values are determined on the basis of signal values from beyond the boundary. They correspond to the signal values which would have occurred before the boundary if the trend in the signal values from beyond the boundary would have continued in the signal values from before the boundary.

The extrapolation circuit can determine, for example a mean value of the grey values $i_1$, $i_2$ from beyond the boundary and determine extrapolated values $e_1$, $e_2$, $e_3$, subject to the hypothesis that this mean value continues to the region before the boundary. The extrapolated values $e_1$, $e_2$, $e_3$ are then:

$$e_1 = (i_1 + i_2)/2$$

$$e_2 = e_3 = (1 - b_1 - b_2)^{-1}(a_1 + a_2 + a_3)(i_1 + i_2)/2$$

$e_2$ and $e_2$ correspond to the constant value of the output signal $u_n$ which would occur in the event of a constant input signal value amounting to the mean value $(i_1 + i_2)/2$.

COMBINATION OF FILTERING OPERATIONS

Figure 3:
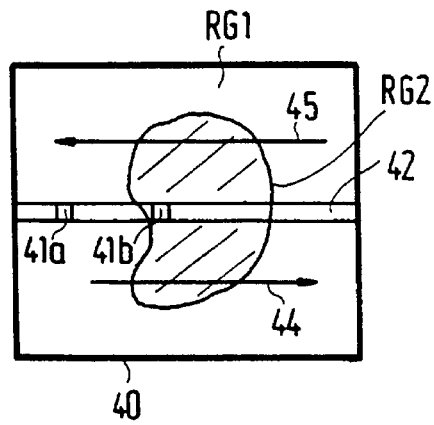
FIG. 3 is a diagrammatic representation of an image.

In order to illustrate the operation of the filters of the FIGS. 1 or 2, FIG. 3 shows diagrammatically an image 40. The image 40 comprises two regions RG1, RG2 and an image line 42 on which locations are situated, two locations 41a and 41b being explicitly indicated. During use of the filter shown in FIG. 1, the grey values associated with successive locations on the image line 42 are successively applied to the input 11 of the filter. The locations are traversed in a first direction from left to right as denoted by an arrow 44.

For each location, for example, 41a, the filter determines a filtered grey value which is composed of the filtered grey value for a location to the left of the location 41a and the grey value of the location itself. Thus, the filtered grey value represents a weighted mean value of the grey values of the locations situated to the left of the location 41a on the image line 42. Thanks to the averaging operation, the filtered grey value contains comparatively less noise than the original grey value.

The determination of the filtered grey value for a location 41b which is situated directly to the right of the boundary between the two regions RG1, RG2 does not utilize a filtered grey value of a location situated to the left of this location 41b. Instead, for example, the grey value of the location 41b itself is used. Thus, no averaging is involved: when the filter shown in FIG. 1 is used, only the grey value of the location 41b itself contributes to the filtered grey value. Therefore, this filtered grey value will contain comparatively as much noise as the original grey value.

In order to reduce this noise contents, a filtering operation as obtained by means of the filter shown in FIG. 1 can be carded out twice in cascade on the grey values of the same locations. During one filtering operation, the locations are traversed from left to right on the image line 42 as indicated by the arrow 44; during the second filtering operation, the locations are traversed from right to left (arrow 45).

First, grey values $i_n$ associated with locations "n"=0, 1, 2 . . . , situated in the image from left to right, are successively applied to the filter as shown in FIG. 1. Subsequently, the result $u_n$ is applied to a second filter as shown in FIG. 1, be it in a sequence in which the results $u_n$ are associated with locations n=M, M−1, M−2 which are situated from right to left in the image. The filtered signal $p_n$ at the end of the cascade is, therefore, $$u_n = ai_n + (1-a)u_{n-1}$$

$$p_n = au_n + (1-a)p_{n+1}$$

in the absence of a boundary.

In the case of detection of i boundary between the locations m−1 and m, upon passage of this location the signal value is replaced:

$$u_m = i_m, \ p_{m-1} = u_{m-1}$$

This cascading of filtering operations results in an output signal $p_n$ for a location "n" which is found to correspond to an averaging of the grey values $i_{n-m}$ of further locations n−m around this location n:

$$p_n = \sum_{m=-\infty}^{\infty} w_{n,m} i_{n-m}$$

Therein, $w_{n,m}$ is a coefficient describing the result of the cascading operation. Thus, for the filtering operation, $w_{n,m}$ is not explicitly used, but implicitly realized by the cascading operation. In positions remote from the boundary, it appears that $w_{n,m}$ is substantially independent of n, being the location for which the filtered value is determined. During the averaging operations, the grey values are uniformly weighted, the weight $w_m$ decreasing as these values originate from a location (n−m) situated further from the location n for which the mean value holds. For locations n in the vicinity of a detected boundary, averaging remains limited to locations to one side of the boundary: in this case $w_{n,m}$ equals zero if the location n−m is situated to a side of the boundary other than the location n.

Figure 4:
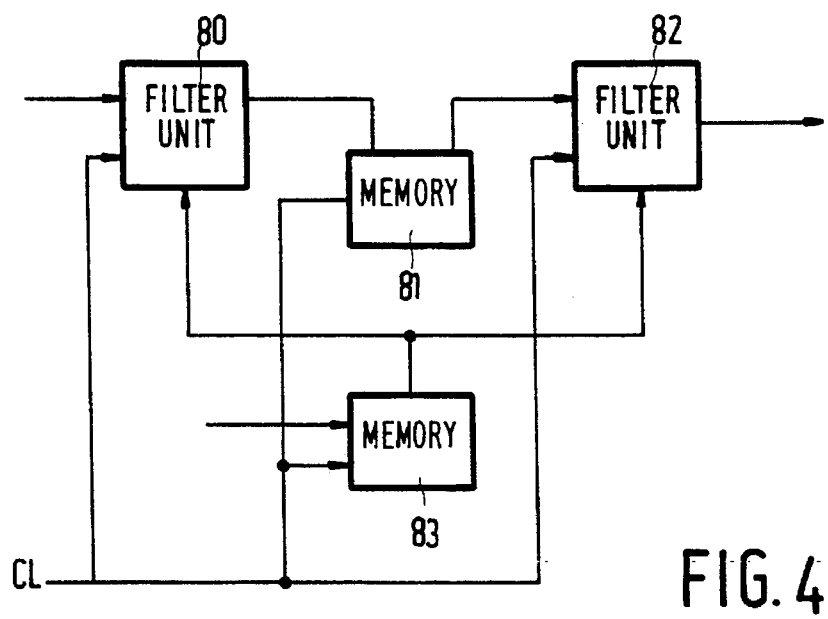
FIG. 4 shows a device for performing cascaded filtering operations in accordance with the invention.

FIG. 4 shows a device for performing cascaded filtering. The device comprises a first and a second filter unit, 80, 82, and a first and a second memory, 81, 83. The output of the first filter unit 80 is coupled to an input of the first memory 81. The output of the first memory 81 is coupled to the input of the second filter unit 82. Outputs of the second memory 83 are coupled to inputs of the first and the second filter unit, 80, 82. Furthermore, a clock line CL is coupled to the filter units, 80, 82 and the memories.

During operation, the filter units 80, 82 operate, for example, as the filter unit 12 of FIG. 1, the signal on the clock line CL determining the instant of refreshment of the contents of the register 128. Indications of transitions in the input signal of the first filter unit 80 are stored in the second memory 83. These indications can be determined, for example, by means of a transition detector 14 according to FIG. 1. This can be realized before the input signal is applied to the first filter unit 80, after which the indication is stored in the memory 83 and is read therefrom, in synchronism with the clock signal, when the input signal is applied to the first filter unit 80. The successive results of the filtering by the first filter unit 80 are stored in the first memory 81. The first memory 81 serves as a LIFO (Last In First Out) memory: after the results for a complete line have been stored in the first memory 81, these results are read again but in a sequence which opt poses the sequence in which they have been formed by the first filter unit 80. The indications from the second memory 83 are also applied (synchronized by the clock line CL) in the reverse order, together with the results read, to the filter unit 82.

Evidently, it is also possible to use a single filter unit for the two filter units 80, 82, said single filter unit serving as the first and the second filter unit, 80, 82, at different instants. The detection of the transitions can take place simultaneously with the presentation of the input signal to the first filter unit 80. In this case, these indications are applied directly to the first filter unit 80 and stored in the second memory 83 for later use by the second filter unit 82. If necessary, the transitions can be detected anew for use by the second filter unit 82.

Besides cascading of filtering operations, paralleling is also possible. In that case two filtering operations are performed on the input signal by means of a filter as shown in FIG. 1. In normal circumstances (in the absence of any boundary), two filtered grey values $u_n$, $v_n$ are then obtained for a location "n":

$$u_n = a\ i_n + (1-a)u_{n-1}$$

$$v_n = a\ i_n + (1-a)v_{n+1}$$

The first formula concerns the traversing of the locations from left to right and has already been given with reference to FIG. 1. The second formula concerns the traversing from right to left. This formula is the same as the first formula, be it that the filtered grey value $v_n$ is dependent on the filtered value $v_{n+1}$ for a location to the right of the location "n".

When a boundary is detected, for the filtering operation in both directions the filtered value stored is replaced by an input value stemming from beyond the boundary; if the transition is situated between a location "m" and a location "m−1":

$$u_m = i_m \text{ and } v_{m-1} = i_{m-1}$$

Thus, $u_n$ as well as $v_n$ will be dependent exclusively on grey values $i_n$ in the image region in which the location is situated.

The output signal $q_n$ of the combined filters constitutes the sum of the filtered signals:

$$q_n = (u_n + v_n)/2$$

In the absence of a boundary, the output signal for a location "n" thus is a mean value taken over grey values to the left as well as to the right of the location. Immediately to the left and to the right of a boundary, the output signal also contains a mean value taken over grey values, be it now from locations to only one, associated side of the boundary.

The difference in the results obtained by cascading and paralleling resides in the fact that in the case of paralleling, the location adjacent the boundary always contributes for more than half to the output signal, regardless of the field of averaging. In contrast therewith, during cascading, the location adjacent the boundary is always uniformly weighted, so that its relative contribution decreases inversely proportionally to the magnitude of the field of averaging. In the case of cascading, therefore, the filtered value contains comparatively less noise than in the case of paralleling.

Generally speaking, for a specific location, a filtered grey value is thus formed by the combination of several recursive filtering operations which approach the relevant location from different directions. For the formation of the filtered grey value for the specific location, each filtering operation utilizes a signal value of the specific location together with the signal values of the preceding locations in its respective approach. (The grey values of the preceding locations contribute thereto in conformity with the distance between their location and the specific location, except if a boundary is present therebetween: the locations situated to the other side of the boundary, relative to the specific location, do not contribute). In the foregoing, the approaches of the various filtering operations were approaches from the left and from the right along the same row of locations; the approach paths are situated one in the prolongation of the other in this case.

MULTI-DIMENSIONAL FILTERING

Figure 5:
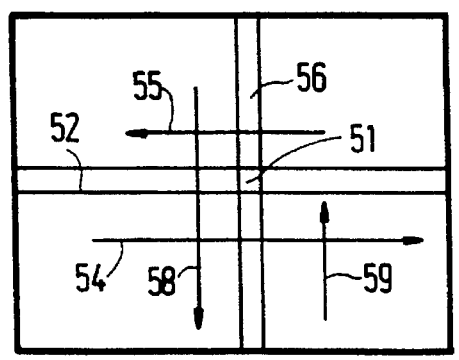
FIG. 5 shows an image in which an image line and an image column are diagrammatically indicated.

Generally speaking, use can also be made of approach paths which are not situated one in the prolongation of the other. By way of example, FIG. 5 shows an image 50 in which an image line 52 and an image column 56 are diagrammatically indicated. The filtering operations as described, for example, with reference to FIG. 1, can be applied to grey values associated with successive locations in a column as well as with successive locations in a row. The various results thus obtained for one and the same location 51 can be combined (for example, by averaging):

$$u_{x,y} = a\ i_{x,y} + (1-a)u_{x-1,y}$$

$$v_{x,y} = a\ i_{x,y} + (1-a)v_{x,y-1}$$

When a boundary has been detected, for the filtering in both directions the filtered value stored is replaced by an input value from beyond the boundary: if the boundary is situated between a location "x,y" and a location "x−1,y":

$$u_{x,y} = i_{x,y}$$

or, if the boundary is situated between a location "x,y" and a location "x,y−1":

$$v_{x,y} = i_{x,y}$$

Thus, $u_{x,y}$ as well as $v_{x,y}$ will be dependent exclusively on grey values $i_{x,y}$ in the region in which the location is situated.

The output signal $q_n$ of the combined filters is the sum of the filtered signals:

$$q_{x,y} = (u_{x,y} + v_{x,y})/2$$

The filtered value thus formed for a location itself again is a mean value of grey values associated With further locations from the environment of this grey value; the environment, however, is in this case 2-dimensional so that it contains more locations than a 1-dimensional environment of the same diameter. Consequently, the noise contributes even less to the filtered value.

The combination of filtering operations can be performed in many ways. In a row 52, a location can be approached in two directions 54, 55; in a column 56, a location can be approached in two directions 58, 59. Each of these approaches can be pair-wise combined and the composite operation in its turn can be combined again with other (possibly also combined) operations. Combination can be realized by paralleling or by cascading. All combinations contribute to the reduction of the relative contribution of noise to the filtered value without degrading the sharpness of boundaries.

An example of an attractive combination is formed by a cascade of row-wise and column-wise filtering, where row-wise filtering and column-wise filtering themselves comprising a cascade of filtering operations in opposite directions. The filtered grey value will thus be an average value taken over a two-dimensional region for each location (also near boundaries). The individual grey values then make a contribution to this mean value which is inversely proportional to the surface of this region.

It has been found that when use is made of this combination the response of the filter is not fully symmetrical with interchanging of the coordinate directions x<->y. This can be prevented by paralleling two of such combinations, filtering in the one combination taking place first in the x direction and subsequently in the y direction, whereas filtering in the other combination is exactly reversed (first in the y direction and subsequently in the x direction). The response is then symmetrical with the interchanges x<->-x, y<->-y and x<->y.

Figure 6:
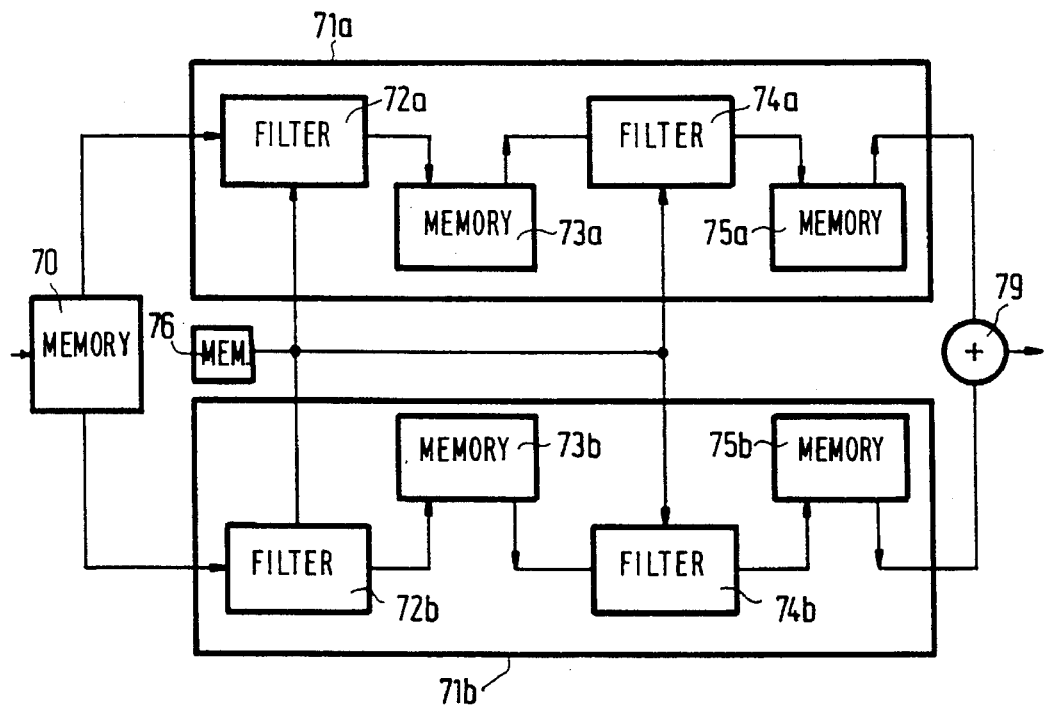
FIG. 6 shows a device for performing a filtering operation in accordance with the invention.

FIG. 6 shows a device for carrying out such a filtering operation. The device comprises a first image memory 70 which is coupled to two parallel branches 71a and 71b. Each branch comprises a series connection of successively a first filter 72a and 72b, a second image memory 73a and 73b, a second filter 74a and 74b and a third image memory 75a and 75b. The outputs of the branches are coupled to the inputs of an adder 79. The output of the adder 79 constitutes an output of the device shown in FIG. 6. The device also comprises a memory 76 for the storage of transition indications. The clock connections required for synchronization of the assembly have been omitted for the sake of clarity.

The filters 72a, 72b, 74a and 74b are constructed, for example, like the filter shown in FIG. 4, except that the memory 76 for the indications of transitions is provided in common for the various filters 72a, 72b, 74a and 74b.

During operation, the input signal is stored in the first image memory 70. The input signal values for respective locations are row-wise applied to the first branch 71a. The first filter 72a of the first branch performs a cascade of filtering operations in the row direction for each row, as described with reference to the FIGS. 3 and 4. The results thereof are stored in the second image memory 73a in the first branch 71a, and are subsequently read column-wise so as to be applied to the second filter 74a of the first branch 71a. For each column, the second filter 74a performs a cascade of filtering operations in the column direction. The result is stored in the third image memory 75a in the first branch 71a.

The result of the operation performed by the first branch is in principle already a two-dimensional filtering of the input signal. As has already been stated, however, it has been found that the pulse response of this filtering operation is not symmetrical with interchanging of the x and y directions.

The operation of the second branch 71b is analogous to that of the first branch 71a, be it that the role of rows and columns is interchanged. The results thus formed for the respective locations by the first branch and the second branch are read from the third image memories 75a and 75b and are added to one another by means of the adder 79. The addition result is symmetrical with interchanging of the x and y directions.

The invention, of course, is not restricted to the filtering of one-dimensional or two-dimensional images in the x and the y direction; it can also be used for multi-dimensional "images", utilizing the z direction or further coordinate directions. Furthermore, oblique directions in the x-y plane can also be used, i.e., the input signal is then composed of the signal values associated with successive locations in a direction in the x-y plane which is not limited to the x or the y direction. By combining the results of filtering operation in different directions, either by cascading or by paralleling or by combinations thereof, filters can be implemented which have a response which is substantially independent of rotation of the image through arbitrary angles.

TRANSMISSION SYSTEM

Figure 7:
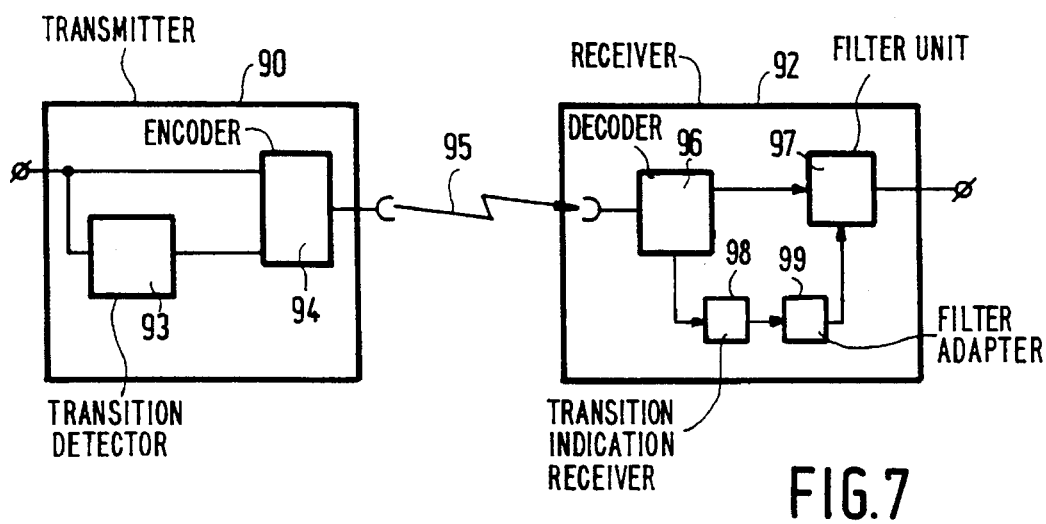
FIG. 7 shows transmission system in accordance with the invention.

FIG. 7 shows a transmission system in accordance with the invention. The system comprises a transmitter 90 which can communicate with a receiver 92 via a channel 95. The transmitter comprises a transition detector 93 and an encoder 94. The receiver comprises a decoder 96, and a filter unit 97, a transition indication receiver 98, and a filter adapter 99. The transmitter 90 and the receiver 92 may be, for example, a television transmitter and receiver; in that case, the channel is formed by the ether. However, the transmitter 90 and the receiver 92 may also be the recording and reproduction section, respectively, of a video recorder. In that case, the channel contains the video tape.

During use, transitions at the side of the transmitter 90 are detected and subsequently encoded by the encoder 94, together with the input signal, followed by transmission. The decoder 96 in the receiver 92 decodes the received signal which includes the indication of the transitions and the input signal. The transition indication receiver 98 receives and detects the indication of the transitions from the decoder 96. The output from the transition indication receiver 98 is then used to control the filter adapter 99. The filter unit can then subsequently filter the input signal, its filtering operation being adapted by the filter adapter 99, in dependence on the indication of the transitions, notably in one of the described manners.

The encoding of the indications can be performed, for example, by forming a two-channel signal of the normal image in addition to a binary image whose pixels have the logic image value zero throughout, except for the pixels which are situated at a transition; the latter pixels have the logic value 1. Alternatively, this binary image can be encoded in a run length code (i.e., encoding on the basis of symbols which symbolize the distances between successive pixel locations on a transition). The transmitter 90 can transmit this code as a digital signal; for this purpose channel encoding techniques can be used. The decoder 96 is then operative to decode this code so as to convert it into indications of the transitions.

The indications of the transitions require far less information capacity than the input signal. Therefore, these indications can be more rigidly encoded than the input signal (for example, by providing a large error correction margin in the indication of transitions or by utilizing a comparatively larger transmission power for suc indications), without requiting a substantial information capacity. The proposed filtering operation is thus hardly susceptible to noise.

What is claimed is:

1. A filter device, comprising a recursive filter unit, a transition detector for detecting a transition in an input signal of the filter unit, and adaptation means for adapting the operation of the filter unit in response to detection of the transition, characterized in that the transition detector detects a boundary between a first region and a subsequent second region in the input signal, and the adaptation means replaces one or more processed signal values, stored in the filter unit for recursive use and derived from signal values from the first region, by one or more signal values from the second region, or by filtered signal values derived from the signal values from the second region before filtering any signal value from the second region.

2. A filter device as claimed in claim 1, characterized in that said filter device averages the input signal, the one or more processed signal values being mean values of already received signal values of the input signal, and that the filter device replaces one or more processed signal values by one or more signal values from the second region which occur at a predetermined distance from the boundary in the input signal.

3. A filter device as claimed in claim 1 or 2, characterized in that said filter device subjects the input signal to a first and a second recursive filtering operation, an input signal for the second recursive filtering operation being formed by signal values of an output signal of the first recursive filtering operation, said signal values being in a reverse sequence in comparison with a sequence in which said signal values had been formed, the role of the first and the second region being interchanged for the second recursive filtering operation in comparison with the first recursive filtering operation.

4. A filter device as claimed in claim 3, characterized in that the input signal values are associated with respective locations in a two-dimensional or multi-dimensional space, and that the filter device uses the input signal values first arranged according to a first dimensional direction as an input signal for the filter unit, and uses, subsequently, results of this filtering operation arranged according to a further dimensional direction as an input signal for the filter unit.

5. A filter device as claimed in claim 4, characterized in that said filter device executes, upon use of the input signal values arranged according to the first dimensional direction as the input signal and upon use of the input signal values arranged according to the second dimensional direction as the input signal, said first and said second recursive filtering operation, referred to together as a first cascade of filtering operations, on the input signal values, the filter device performing, on the same input signal values on which the first cascade is performed, a second cascade of filtering operations, which is equal to the first cascade, except for interchanging of the first and the second dimensional direction, the filter device comprising combination means for combining the results formed from the first and the second cascade for the same location.

6. A filter device as claimed in claim 1, characterized in that the input signal values are associated with respective locations in a two-dimensional or multi-dimensional space, the transition detector detecting the boundary on the basis of two-dimensional or multi-dimensional signal patterns in respective environments of respective locations.

7. A transmission system comprising a filter device as claimed in claim 1, characterized in that the transmission system is subdivided into a transmitter and a receiver, the transmitter comprising the transition detector and transmits a combination of the input signal and an indication of detection of the transition to the receiver which comprises the filter unit, the adaptation means and transition indication receiving means for receiving the detection indication, said transition indication receiving means controlling the adaptation means in response to the indicated detections.

8. A receiver suitable for a transmission system as claimed in claim 7, characterized in that said receiver comprises the filter unit, the adaptation means and the transition indication receiving means, said transition indication receiving means controlling the adaptation means in response to the indications of detection received from the transmitter.

9. A method of filtering an input signal, said method including the steps:

subjecting the input signal to a recursive filtering operation;

detecting transitions in an input signal; and adapting the recursive filtering operation in response to detection of the transition, characterized in that the transition is a boundary between a first and a subsequent second region in the input signal, the step of adapting the recursive filtering operation comprising:

replacing one or more processed signal values, said processed signal values having been generated during the recursive filtering operation and at least temporarily stored for recursive use during the recursive filtering operation and derived from signal values from the first region by one or more signal values from the second region, or by filtered signal values derived from the signal values from the second region, before subjecting any signal value from the second region to the recursive filtering operation.

* * * * *